US012607700B2

(12) United States Patent
Xu et al.

(10) Patent No.: US 12,607,700 B2
(45) Date of Patent: Apr. 21, 2026

(54) RANDOM TRANSIENT POWER TEST SIGNAL GENERATOR BASED ON THREE-DIMENSIONAL MEMRISTIVE DISCRETE MAP

(71) Applicant: UNIVERSITY OF ELECTRONIC SCIENCE AND TECHNOLOGY OF CHINA, Chengdu (CN)

(72) Inventors: Bo Xu, Chengdu (CN); Yuhua Cheng, Chengdu (CN); Kai Chen, Chengdu (CN); Jia Zhao, Chengdu (CN); Hang Geng, Chengdu (CN); Yifan Wang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 352 days.

(21) Appl. No.: 18/233,921

(22) Filed: Aug. 15, 2023

(65) Prior Publication Data

US 2023/0386595 A1     Nov. 30, 2023

(30) Foreign Application Priority Data

Apr. 11, 2023     (CN) .......................... 202310380708.3

(51) Int. Cl.
G01R 35/04     (2006.01)

(52) U.S. Cl.
CPC ................................... G01R 35/04 (2013.01)

(58) Field of Classification Search
CPC ...... G01R 35/04; G01R 35/005; G01R 35/02; G01R 19/00; G06F 7/582; G06F 1/022
See application file for complete search history.

(56) References Cited

U.S. PATENT DOCUMENTS

| | | | |
|---|---|---|---|
| 11,563,444 B1 * | 1/2023 | Jaklitsch | ................. G06F 1/022 |
| 2002/0103838 A1 * | 8/2002 | Kelly | ........................ G06F 1/03 |
| | | | 708/250 |

OTHER PUBLICATIONS

Wang et al., "OOK power model based dynamic error testing for smart electricity meter", Measurement Science and Technology, 2017, vol. 28, No. 025015, pp. 1-7.
Wang et al., "Pseudorandom Dynamic Test Power Signal Modeling and Electrical Energy Compressive Measurement Algorithm", Measurement Science Review, 2018, vol. 18, No. 5, pp. 207-217.
Wang et al., "Dynamic test signal modelling and a compressed sensing based test for electric energy meter errors", Measurement, 2020, vol. 164, No. 107915.

* cited by examiner

*Primary Examiner* — Catherine T. Rastovski
*Assistant Examiner* — Sharad Timilsina
(74) *Attorney, Agent, or Firm* — Oliff PLC

(57) ABSTRACT
A random transient power test signal generator based on three-dimensional memristive discrete map, which utilizes a three-dimensional parallel bi-memristor Logistic map module to generate two pseudo-random sequences, and based on the two pseudo-random sequences, uses two waveform output modules to generate a transient voltage signal and a transient current signal respectively, thus the random transient power testing signal is obtained.

1 Claim, 7 Drawing Sheets

RANDOM TRANSIENT POWER TEST SIGNAL GENERATOR BASED ON THREE-DIMENSIONAL MEMRISTIVE DISCRETE MAP

FIELD OF THE INVENTION

This application claims priority under the Paris Convention to Chinese Patent Applications No. 202310380708.3, filed on Apr. 11, 2023, the entirety of which is hereby incorporated by reference for all purposes as if fully set forth herein.

The present invention relates to the field of power test signal, more particularly to a random transient power test signal generator based on three-dimensional memristive discrete map.

BACKGROUND OF THE INVENTION

Transient power measurement is one of the most important features of a power analyzer (PA). In the research and development of power analyzer, an arbitrary waveform generator (AWG) usually is needed to output a voltage signal and a current signal with random phase to simulate the dynamic power of an equipment under test. However, both of commercial arbitrary waveform generator and specialized power calibration source (e.g., Fluke 6003A) don't have the function of outputting random dynamic signal, that is very inconvenient for the research and development of high-precision measurement of power meters and the calibration of power meters, such as power analyzer and smart power meter.

In the journal Measurement Science and Technology, a paper with the title of "OOK power model based dynamic error testing for smart electricity meter" has been published on 12 Jan. 2017, To solve the dynamic error testing problems, the paper establishes an on-off-keying (OOK) testing dynamic current model and an OOK testing dynamic load energy (TDLE) model. Then two types of TDLE sequences and three modes of OOK testing dynamic power are proposed. Based on the above models, an OOK TDLE sequence generation equipment is developed and a dynamic error testing system is constructed. Using the testing system, five kinds of meters were tested in the three dynamic power modes. The test results show that the dynamic error is closely related to dynamic power mode and the measurement uncertainty is 0.38%. In the paper, an OOK (on-off-keying) control signal as follows:

$$a_n = v_2(t) = \begin{cases} 1, & nT \le t \le (n+1)T & \text{signify the current signal is ON} \\ 0, & \text{else,} & \text{signify the current signal is OFF} \end{cases}$$

has been adopted to truncate instantaneous test current to obtain an OOK testing dynamic power. Then, as shown in FIG. 1, the truncated instantaneous test current is a dynamic current signal. The period is a full cycle, both of the starting phase and ending phase are 0, completely having no randomness. Therefore, the stimulated output of a high-precision transient power testing signal (high-precision transient voltage and transient current signal) with random characteristic can't be realized.

SUMMARY OF THE INVENTION

The present invention aims to overcome the deficiencies of the prior art, and provides a random transient power test signal generator based on three-dimensional memristive discrete map, so as to realize a stimulated output of the high-precision transient power testing signal (high-precision transient voltage and transient current signal) with random characteristic.

To achieve these objectives, in accordance with the present invention, a random transient power test signal generator based on three-dimensional memristive discrete map is provided, comprising:

a timing control module, which is used for counting a system clock, wherein when the counting value of the timing control module reaches a counting threshold DM_CNT, the output of the timing control module as a system enable signal $En_{sys}$ turns into high level and holds on a system clock cycle, and then turns into low level, the period of system enable signal $En_{sys}$ is the updating period of a random transient power testing signal, which is denoted by $t_1$;

a three-dimensional parallel bi-memristor Logistic map module, which is used for generating two pseudo-random sequences, the mapping model of the three-dimensional parallel bi-memristor Logistic map is:

$$\begin{cases} x_{n+1} = ax_n(1 - x_n) + bx_n\left(k_0 + k_1 y_n + k_2 y_n^2\right) + cx_n\left(h_1 z_n + h_2 z_n^2\right) \\ y_{n+1} = x_n + y_n \\ z_{n+1} = x_n + z_n \end{cases}$$

where a is a parameter of logistic mapping, b and c respectively are coupling coefficients between discrete memristors $$k_0 + k_1 y_n + k_2 y_n^2, h_1 z_n + h_2 z_n^2$$

and the logistic mapping, $k_0$, $k_1$, $k_2$ respectively are the 0-order coefficient, the 1-order and the 2-order coefficient of discrete memristor $$k_0 + k_1 y_n + k_2 y_n^2, h_1, h_2$$

respectively are the 1-order coefficient and the 2-order coefficient of discrete memristor $$h_1 z_n + h_2 z_n^2, x_n, y_n \text{ and } z_n$$

respectively are the three-dimensional status values of time n, $x_{n+1}$, $y_{n+1}$ and $z_{n+1}$ respectively are the three-dimensional status values of time n+1;

when a rising edge occurs in system enable signal $En_{sys}$, starting the three-dimensional parallel bi-memristor Logistic map module to update the three-dimensional status values according to the mapping model and inputted three-dimensional initial status values $x_0$, $y_0$, $z_0$; after time duration of $t_2$, ending the update, the time of ending is denoted by L, then taking P three-dimensional status values, $x_L$, $x_{L-1}$, . . . , $x_{L-P+1}$ as one pseudo-random sequence, which is denoted by x[P−1: 0], and taking P three-dimensional status values $y_L y_{L-1}, \ldots, y_{L-P+1}$ as another pseudo-random sequence, which is denoted by y[P−1:0];

meanwhile, when starting the three-dimensional parallel bi-memristor Logistic map module to update the three-dimensional status values, an update status signal $EN_{PMLM}$ outputted by the three-dimensional parallel bi-memristor Logistic map module turns into high level and holds on, when the update ends, update status signal $EN_{PMLM}$ automatically is set to 0;

a waveform output reset module, which is used for generating a waveform output reset signal $DDS_{rst}$ wherein when a rising edge is detected in system enable signal $En_{sys}$, the waveform output reset signal $DDS_{rst}$ set to low level, when a falling edge is detected in update status signal $EN_{PMLM}$, the waveform output reset signal $DDS_{rst}$ is set to high level;

two waveform output modules, One is used for receiving pseudo-random sequence x[P−1:0], another is used for receiving pseudo-random sequence y[P−1:0], waveform output reset signal $DDS_{rst}$ is sent to the two waveform output modules respectively, wherein the waveform output module comprises a DDS (Direct Digital Synthesizer) module, an output control module and an output selection module;

wherein the DDS module has two registers $R_1$, $R_2$ and a DDS reset module, register $R_1$ is used for storing a frequency control word $K_f$, $M_1$ bits of status values chosen from the received pseudo-random sequence are taken as a starting phase control word IPh and stored in register $R_2$ waveform output reset signal $DDS_{rst}$ resets the DDS module through the DDS reset module, namely when the level of waveform output reset signal $DDS_{rst}$ is low, the level of a DDS enable signal $EN_{DDS}$ outputted by the DDS reset module is also low, the DDS module doesn't work, when the level of waveform output reset signal DDS is high, the level of DDS enable signal $EN_{DDS}$ outputted by the DDS reset module is also high, the DDS module starts to work: reading frequency control word $K_f$ from register $R_1$ and generating a $M_1$-bit accumulated address according to the principle of DDS, then adding starting phase control word IPh in register $R_2$ and the $M_1$-bit accumulated address together to obtain a reading address Raddr, then reading waveform data from a waveform memory according to reading address Raddr and taking the waveform data as the output of the DDS module;

wherein the output control module has a counter reset module, an integral period counter and a decimal period counter, waveform output reset signal $DDS_{rst}$ resets the integral period counter through the counter reset module, namely when the level of waveform output reset signal $DDS_{rst}$ is low, the level of a counter enable signal $EN_{cnt1}$ outputted by the counter reset module is also low, the integral period counter doesn't work and its counting value $CNT_1=0$, at the same time, a decimal period counter enable signal $EN_{cnt2}$ outputted by the integral period counter is also low, which makes the level of a DDS selection signal $SEL_{DDS}$ outputted by the decimal period counter low;

wherein the inputs of the integral period counter comprise reading address Raddr obtained in the DDS module, starting phase control word IPh chosen from the received pseudo-random sequence, a control word NP for number of periods and counter enable signal $EN_{cnt1}$ outputted by the counter reset module, where control word NP for number of periods is composed of the $M_2$, bits of status values chosen from the received pseudo-random sequence,

when waveform output reset signal $DDS_{rst}$ turns from low level to high level, counter enable signal $EN_{cnt1}$ outputted by the counter reset module also turns from low level to high level, which enables the integral period counter to work: counting value $CNT_1$ of the integral period counter is automatically added by according to the two following rules:

rule 1: if Raddr_dly<Raddr, when Raddr_dly≤Iph and Iph≤Radadr, $CNT_1=CNT_1+1$, otherwise, counting value $CNT_1$ remains unchanged;

rule 2: if Raddr_dly>Raddr, when Raddr_dly≤Iph or Iph≤Raddr, $CNT_1=CNT_1+1$, otherwise, counting value $CNT_1$ remains unchanged, where Raddr_dly is a reading address obtained by delaying reading address Raddr one clock period, namely is the reading address of previous clock period;

when $CNT_1=NP$ decimal period counter enable signal $EN_{cnt2}$ outputted by the integral period counter turns into high level, otherwise, remains at low level;

when $CNT_1=2^{M_1}$, DDS enable signal $EN_{DDS}$ is set to low level, which resets the DDS module;

$M_3$ bits of status values chosen from the received pseudo-random sequence compose an ending phase control word Eph, when decimal period counter enable signal $EN_{cnt2}$ turns into high level, which enables the decimal period counter, wherein the inputs of the decimal period counter comprise reading address Raddr obtained in the DDS module, ending phase control word Eph chosen from the received pseudo-random sequence and decimal period counter enable signal $EN_{cnt2}$, DDS selection signal $SEL_{DDS}$ outputted by the decimal period counter changes according to the two following rules:

rule 1: if Raddr_dly<Raddr, when Raddr_dly≤Eph and Eph≤Raddr, DDS selection signal $SEL_{DDS}$ turns into high level, otherwise, remains at low level;

rule 2: if Raddr_dly>Raddr, when Radar_dly≤Eph or Eph≤Radar, DDS selection signal $SEL_{DDS}$ turns into high level, otherwise, remains at low level;

wherein the output selection module is used for selecting the output of the waveform output module according to DDS selection signal $SEL_{DDS}$: when the level of DDS selection signal $SEL_{DDS}$ is low, selecting the output of the DDS module as the output of the waveform output module, when the level of DDS selection signal $SEL_{DDS}$ is high, selecting low level as the output of the waveform output module;

two DACs, which are used for respectively performing a digital to analog conversion on the outputs of the two waveform output modules to obtain two signals that are taken as a transient voltage signal and a transient current signal respectively, namely the random transient power testing signal is obtained.

The objectives of the present invention are realized as follows:

In accordance with the present invention, a random transient power test signal generator based on three-dimensional memristive discrete map is provided, which utilizes a three-dimensional parallel bi-memristor Logistic map module to generate two pseudo-random sequences, and based on the two pseudo-random sequences, uses two waveform output modules to generate a transient voltage signal and a transient current signal respectively, thus the random transient power testing signal is obtained. The three-dimensional parallel bi-memristor Logistic map in the present invention not only can significantly improve the complexity of chaos of 1-dimensional memristive logistic map (MLM), but also can greatly extend its range of chaos. In addition, a performance evaluation shows that the three-dimensional parallel bi-memristor Logistic map proposed in the present invention has more robust hyperchaotic behavior than existing 2-dimensional memristive logistic map in much larger chaos range. Moreover, the two pseudo-random sequences generated by the three-dimensional parallel bi-memristor Logistic map module combines with DDS in the present invention, which can generate a transient power signal with completely random period, starting phase and ending phase. Thus, a stimulated output of the high-precision transient power testing signal (high-precision transient voltage and transient current signal) with random characteristic is realized, which makes the development and calibration of high-precision measurement of power meters more convenient.

BRIEF DESCRIPTION OF THE DRAWING

The above and other objectives, features and advantages of the present invention will be more apparent from the following detailed description taken in conjunction with the accompanying drawings, in which:

FIG. 4(a) is a diagram of phase trajectory of MLM (1-dimensional Memristive Logistic Map) model, FIG. 4(b) is a diagram of phase trajectory of 2D-DMLM (Two-Dimensional Discrete Memristor Coupled Logistic Map) model, FIG. 4(c) is a diagram of phase trajectory of 3D-PMLM (Three-Dimensional Parallel bi-Memristor Logistic. Mapping) model, FIG. 4(d) is a histogram of MLM model, FIG. 4(e) is a histogram of 2D-DMLM model, FIG. 4(f) is a histogram of 3D-PMLM model;

FIG. 5(a) is a waveform diagram of multiple updating periods of channel 1 and channel 2, FIG. 5(b) is the waveform diagram of No. 3 period of channel 1, FIG. 5(c) is the waveform diagram of No. 3 period of channel 2, FIG. 5(d) is the waveform diagram of No. 5 period of channel 1, FIG. 5(e) is the waveform diagram of No. 5 period of channel 2;

FIG. 6(a) is a waveform diagram of multiple updating periods of channel 1 and channel 2, FIG. 6(b) is the waveform diagram of No. 3 period of channel 1, FIG. 6(c) is the waveform diagram of No. 3 period of channel 2, FIG. 6(d) is the waveform diagram of No. 5 period of channel 1, FIG. 6(e) is the waveform diagram of No. 5 period of channel 2.

DETAILED DESCRIPTION OF THE PREFERRED EMBODIMENT

Figure 1:
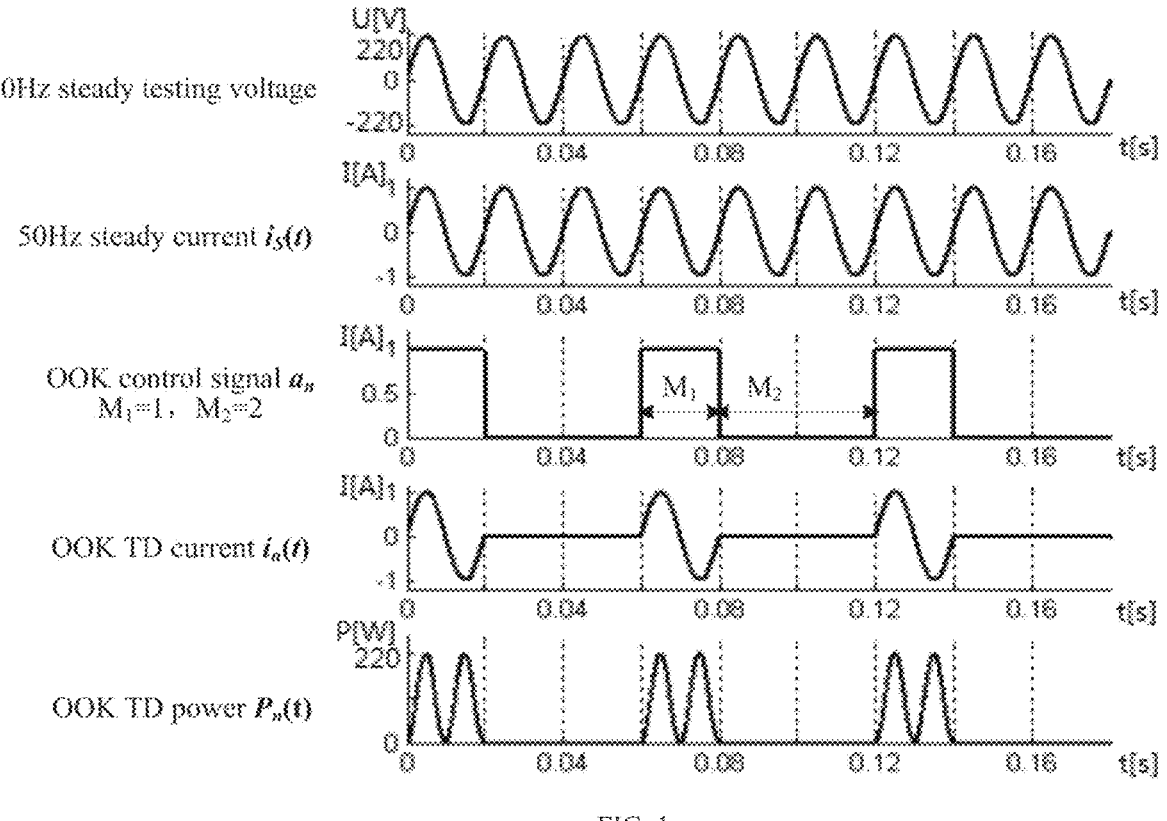
FIG. 1 is a time diagram of generating a testing dynamic current in prior art.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

Figure 2:
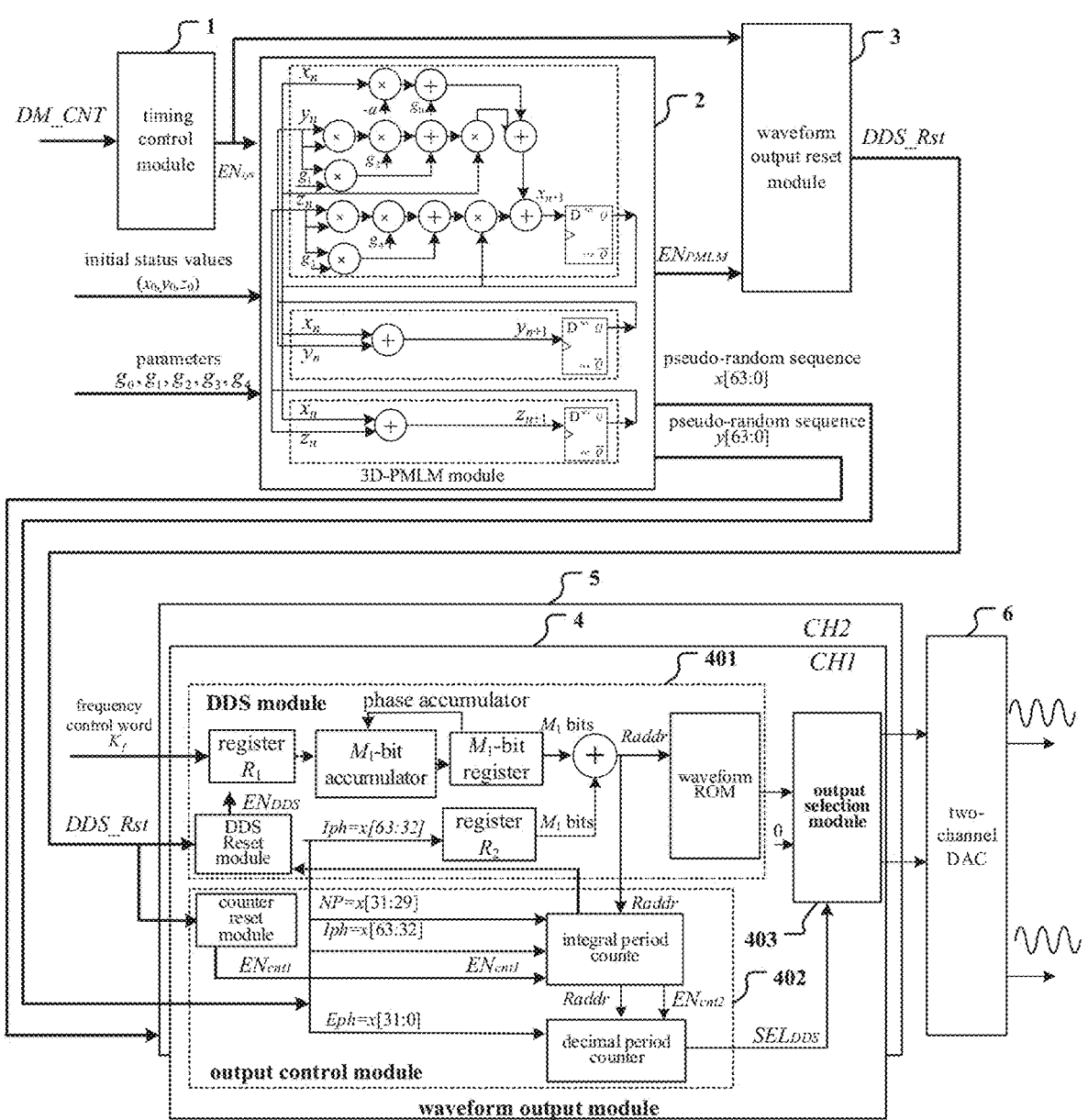
FIG. 2 is a diagram of a random transient power test signal generator based on three-dimensional memristive discrete map in accordance with one embodiment of the present invention.

FIG. 2 is a diagram of a random transient power test signal generator based on three-dimensional memristive discrete map in accordance with one embodiment of the present invention.

In the embodiment, as shown in FIG. 2, the present invention provides a random transient power test signal generator based on three-dimensional memristive discrete map, which comprises a timing control module 1, a three-dimensional parallel bi-memristor Logistic map module (hereinafter referred to as 3D-PMLM module) 2, a waveform output reset module 3, two waveform output modules 4, 5 (used for channel 1 and channel 2 respectively) and a two-channel DAC module 6. The present is implemented by a FPGA (field programmable gate array).

Figure 3:
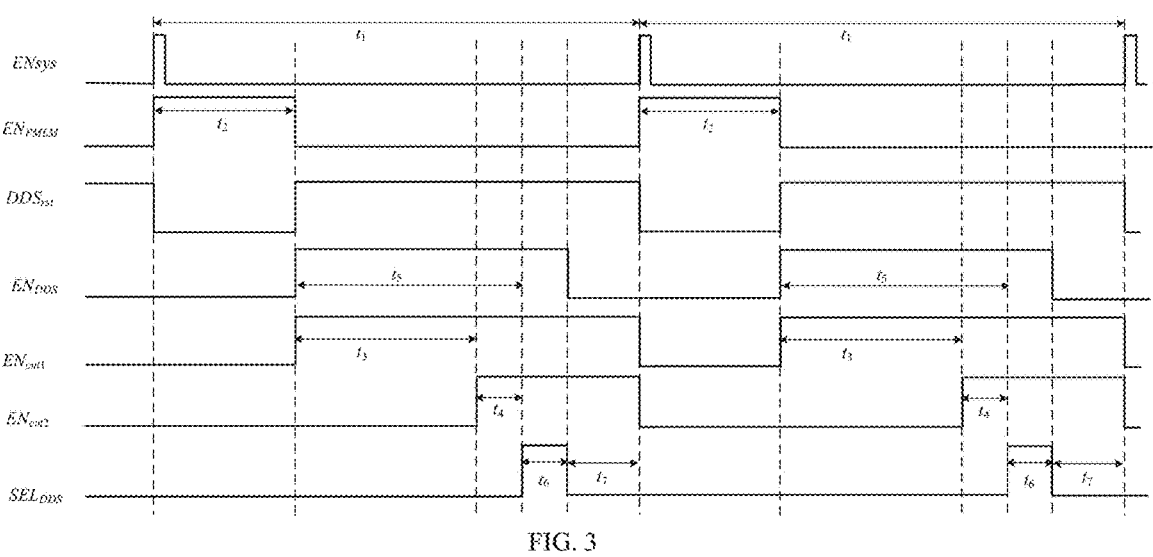
FIG. 3 is a timing diagram of control signals in accordance with one embodiment of the present invention.
Figure 4A:
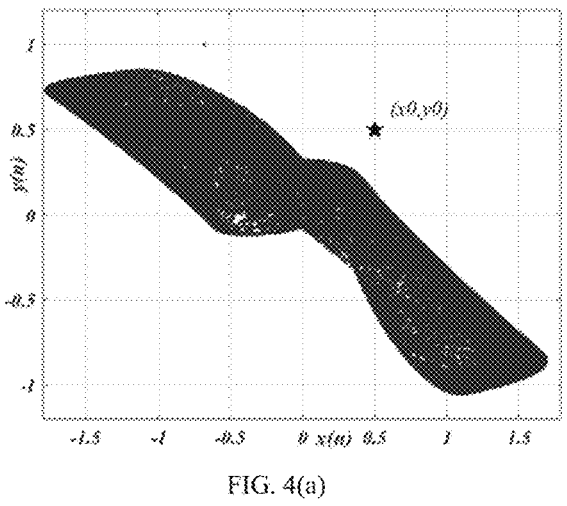
FIG. 4(a)-FIG. 4(f) are diagrams of phase trajectories and histograms of three logistic maps, where
Figure 4B:
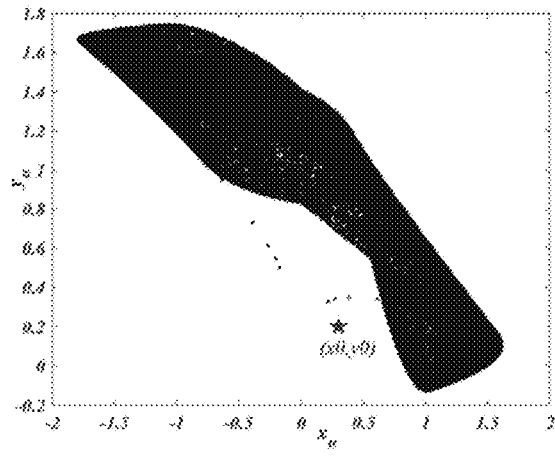
Figure 4C:
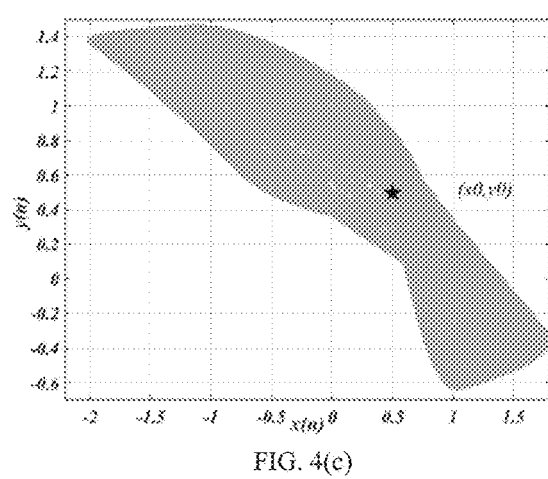
Figure 4D:
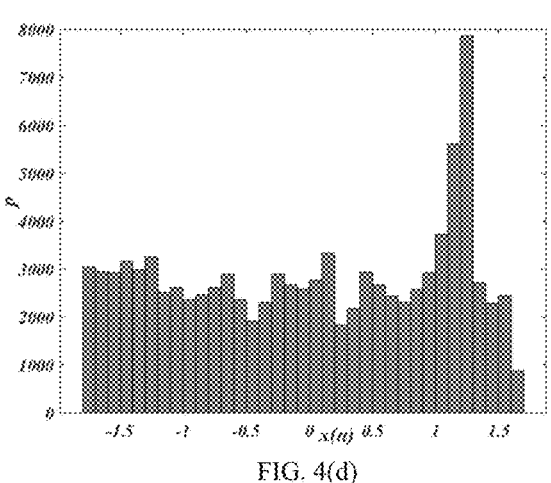
Figure 4E:
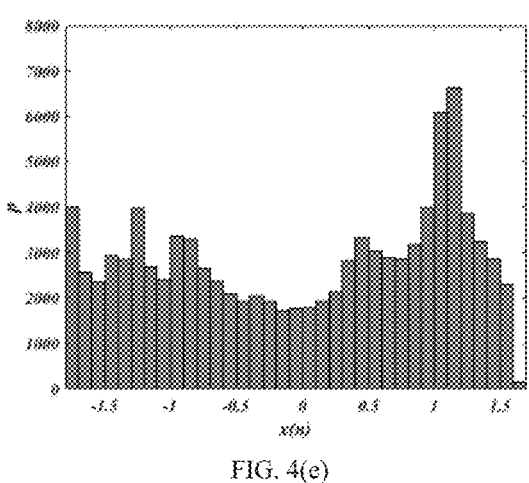
Figure 4F:
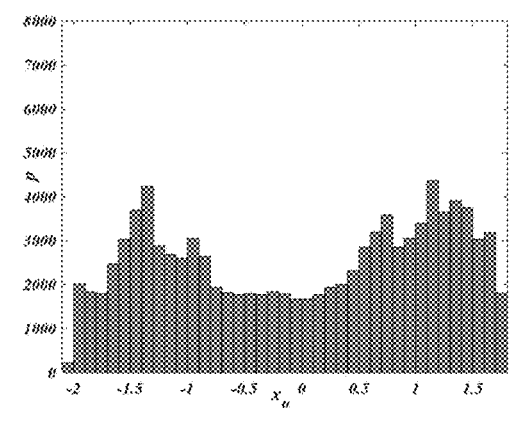

The timing control module 1 is used for counting a system clock, and when the counting value of the timing control module reaches a counting threshold DM_CNT, the output of the timing control module as a system enable signal $En_{sys}$ turns into high level and holds on a system clock cycle, and then turns into low level, the period of system enable signal $En_{sys}$ is the updating period of a random transient power testing signal, as shown in FIG. 3, which is denoted by $t_1$. As shown in FIG. 2, system enable signal $En_{sys}$ turns outputted by the timing control module 1 are sent to the 3D-PMLM module 2 and the waveform output reset module 3 respectively.

In the embodiment, counting threshold DM_CNT is sent to the timing control module 1 by a host computer. Counting threshold DM_CNT can be calculated according to the following formula:

$$DM\_CNT = t_1/T_s$$

where $T_s$ is a period which corresponds to the system clock of the FPGA, $t_1$ is also the updating period of the 3D-PMLM module 2, namely, the 3D-PMLM module 2 updates its three-dimensional status values $x_n$, $y_n$, $z_n$ at the interval of $t_1$.

The 3D-PMLM module 2 is used for generating two pseudo-random sequences x[P−1:0], y[P−1:0], the mapping model in the 3D-PMLM module 2 is:

$$\begin{cases} x_{n+1} = ax_n(1 - x_n) + bx_n\left(k_0 + k_1y_n + k_2y_n^2\right) + cx_n\left(h_1z_n + h_2z_n^2\right) \\ y_{n+1} = x_n + y_n \\ z_{n+1} = x_n + z_n \end{cases}$$

where a is a parameter of logistic mapping, b and c respectively are coupling coefficients between discrete mersisters $$k_0 + k_1y_n + k_2y_n^2, h_1z_n + h_2z_n^2$$

and the logistic mapping, $k_0$, $k_1$, $k_2$ respectively are the 0-order coefficient, the 1-order coefficient and the 2-order coefficient of discrete memristor $$k_0 + k_1y_n + k_2y_n^2, h_1, h_2$$

respectively are the 1-order coefficient and the 2-order coefficient of discrete memristor $$h_1 z_n + h_2 z_n^2, x_n, y_n \text{ and } z_n$$

respectively are the three-dimensional status values of time n, $x_{n+1}$, $y_{n+1}$ and $z_{n+1}$ respectively are the three-dimensional status values of time n+1.

When a rising edge occurs in system enable signal $En_{sys}$, starting the 3D-PMLM module 2 to update the three-dimensional stains values according to the mapping model and inputted three-dimensional initial status values $x_0$, $y_0$, $Z_0$. After time duration of $t_2$, ending the update. The time of ending is denoted by L, then taking P three-dimensional status values $x_L$, $x_{L-1}$, . . . , $x_{L-P+1}$ as one pseudo-random sequence, which is denoted by x[P−1:0], and taking P three-dimensional status values $y_L$, $y_{L-1}$, . . . , $y_{L-P+1}$ another pseudo-random sequence, which is denoted by y[P−1:0]. In the embodiment, P=64, namely the two pseudo-random sequences are x[63:0] and y[63:0] respectively. The two pseudo-random sequences x[63:0], y[63:0] are needed to meet the double precision format of IEEE754.

Meanwhile, when starting the 3D-PMLM module 2 to update the three-dimensional status values, an update status signal $EN_{PMLM}$ outputted by the 3D-PMLM module 2 turns into high level and holds on, when the update ends, the update status signal $EN_{PMLM}$ automatically is set to 0.

In the embodiment, the 3D-PMLM module 2 is realized in the FPGA, To save the limited IP cores in the FPGA, firstly we need to optimize the mapping model in aspect of algorithm, the optimized mapping model is $$\begin{cases} x_{n+1} = x_n(g_0 - ax_n) + x_n(g_1 y_n + g_2 y_n^2) + x_n(g_3 z_n + g_4 z_n^2) \\ y_{n+1} = x_n + y_n \\ z_{n+1} = x_n + z_n \end{cases}$$

Where parameters $g_0$=a+$bk_0$, $g_1$=$bk_1$, $g_2$=$bk_2$, $g_3$=$ch_1$, $g_4$=$ch_2$.

As shown in FIG. 1, the 3D-PMLM module 2 is built by multipliers and adders according to above optimized model. The three-dimensional status values $x_{n+1}$, $y_{n+1}$, $z_{n+1}$ of time n+1 are latched by three D flip-flops respectively and taken as three-dimensional status values $x_n$, $y_n$, $z_n$ of time n of next update, where three-dimensional initial status values $x_0$, $y_0$, $z_0$ and parameters $g_0$, $g_1$, $g_2$, $g_3$, $g_4$ are sent to the 3D-PMLM module 2 by the host computer.

In the embodiment, spectral entropy (SE), permutation entropy (PE), correlation dimension (CorDim), Kaplan-Yorke dimension (K-YDim) are used for evaluating the performance of hyperchaotic random sequence. Comparing the 3D-PMLM proposed in the present invention with 1-dimensional Memristive Logistic Map (MLM) and Two-Dimensional Discrete Memristor Coupled Logistic Map (2D-DMLM), the comparison results are shown in table 1, wherein the lengths of the sequences for comparing are set to $10^5$, in the process of comparing, the parameters adopted by MLM model are μ=0.1, a=−1, b=1 and k=1.87, the initial status values are ($x_0$, $y_0$)=(0.5, 0.5) the parameters adopted by MLM model are μ=0.2, $R_1$=−2, $R_2$=−1 and k=1.99, the initial status values are ($x_0 y_0$)=(0.3, 0.2), the parameters adopted by 3D-PMLM model are a=0.2, b=0.9, c=−0.2, $k_0$=−1.2, $k_1$=−3, $k_2$=−2, $h_1$=−2 and $h_2$=−0.5, the initial status values are ($x_0$, $y_0 z_0$)=(0.5, 0.5, 0.5).

TABLE 1

| Model | SE | PE | CorDim | K-YDim |
|---|---|---|---|---|
| MLM | 0.817 | 0.675 | 1.412 | 2.0 |
| 2D-DMLM | 0.844 | 0.717 | 1.518 | 2.0 |
| 3D-PMLM | 0.854 | 0.720 | 1.60 | 3.0 |

From table 1, we can see that the pseudo-random sequences (hyperchaotic sequences) generated by the 3D-PMLM model proposed in the present invention not only can significantly improve the complexity of chaos of the sequence generated by 1-dimensional memristive logistic map (MLM), but also can greatly extend its range of chaos. In addition, a performance evaluation shows that the 3D-PMLM model proposed in the present invention has more robust hyperchaotic behavior than existing 2D-DMLM in much larger chaos range.

FIG. 4(*a*)-FIG. 4(*c*) are diagrams of phase trajectories of the three models of MLM, 2D-DMLM and 3D-PMLM. From the figures, we can see that all chaotic attractors are distributed in a bounded area with complex random coordinate positions. FIG. 4(*d*)-FIG. 4(*f*) are histograms of sequence $x_n$ generated by the three models of MLM, 2D-DMLM and 3D-PMLM. From the figures, we can see that the pseudo-random sequence generated by 3D-PMLM model is more uniform. Secondly, the pseudo-random sequences generated by the three mapping models resemble a noise signal, and their values fluctuate unpredictably and without regularity.

To further verify the randomness of the pseudo-random sequence generated by 3D-PMLM model in the present invention, a test is performed by using the statistical test suite of NIST Special Publication (SP) 800-22. The statistical test suite comprises 15 sub-tests. Each sub-test will generate two results: P-value and pass rate of the pseudo-random sequence. P-value is a critical parameter for measuring the performance of a discrete sequence, when P-value is greater than 0.01, the pseudo-random sequence passes the randomness test, otherwise, is not random. After 3D-PMLM model iterates $4 \times 10^8$ times, the status values of interval [$1 \times 10^8$, $4 \times 10^8$] are converted into a binary sequence. In the test of NIST Special Publication (SP) 800-22, the length of sequence is set to $1 \times 10^6$, the number of sequences is set to 1000, the corresponding test results are shown in table 2. From table 2, we can see that the generated pseudo-random sequence can pass all sub-tests, which further shows the high complexity and high availability of the 3D-PMLM model proposed in the present invention.

TABLE 2

| NO. | Sub-tests | Status value $x_n$ | | State value $y_n$ | |
|---|---|---|---|---|---|
| | | Pass rate | P-value | Pass rate | P-Value |
| 1 | Frequency | 0.989 | 0.32985 | 0.99375 | 0.807412 |
| 2 | BlockFrequency | 0.991 | 0.510153 | 0.99375 | 0.737414 |

TABLE 2-continued

| | | Status value $x_n$ | | State value $y_n$ | |
| NO. | Sub-tests | Pass rate | P-value | Pass rate | P-Value |
| --- | --- | --- | --- | --- | --- |
| 3 | Cum. Sums(F) | 0.989 | 0.444691 | 0.99625 | 0.980883 |
| | Cum. Sums(R) | 0.989 | 0.194813 | 0.99375 | 0.985226 |
| 4 | Runs | 0.993 | 0.149495 | 0.9925 | 0.104062 |
| 5 | Longest Run | 0.991 | 0.188601 | 0.98875 | 0.569766 |
| 6 | Rank | 0.990 | 0.068145 | 0.98875 | 0.943759 |
| 7 | FFT | 0.991 | 0.653773 | 0.995 | 0.018223 |
| 8 | NonOverlappingTemplate | 0.990 | 0.467 | 0.990 | 0.505 |
| 9 | OverlappingTemplate | 0.989 | 0.234373 | 0.99125 | 0.053627 |
| 10 | Universal | 0.989 | 0.267573 | 0.99125 | 0.55442 |
| 11 | ApproximateEntropy | 0.986 | 0.765632 | 0.99875 | 0.71466 |
| 12 | RandomExcursions | 0.988 | 0.536 | 0.986 | 0.488 |
| 13 | RandomExcursionsVariant | 0.992 | 0.542 | 0.990 | 0.650 |
| 14 | Serial | 0.994 | 0.382115 | 0.98875 | 0.255705 |
| | Serial | 0.990 | 0.916599 | 0.99 | 0.286131 |
| 15 | LinearComplexity | 0.993 | 0.870856 | 0.98875 | 0.909759 |

In the embodiment, as shown in FIG. 1, the waveform output reset module 3 is used for generating a waveform output reset signal $DDS_{rst}$ wherein the input signals of the waveform output reset module 3 are system enable signal $En_{sys}$ and update status signal $EN_{PMLM}$. When a rising edge is detected in system enable signal $En_{sys}$, the waveform output reset signal $DDS_{rst}$ is set to low level, when a falling edge is detected in update status signal $EN_{PMLM}$, the waveform output reset signal $DDS_{rst}$ is set to high level. Namely, resetting first, waiting until two pseudo-random sequences x[P–1:0], y[P–1:0] are generated, then starting the two waveform output modules 4, 5 by the waveform output reset module 3.

One of the two waveform output modules 4, 5 is used for receiving pseudo-random sequence x[P–1:0], another is used for receiving pseudo-random sequence y[P–1:01]. Waveform output reset signal is sent to the two waveform output modules 4, 5 respectively.

In the embodiment, the waveform output module 4 (The waveform output module 5 is the same as the waveform output module 4, which is not drawn in details in FIG. 1) comprises a DDS (Direct Digital Synthesizer) module 401, an output control module 402 and an output selection module 403.

The DDS module 401 has two registers $R_1R_2$ and a DDS reset module. Register $R_1$ is used for storing a frequency control word $K_f$, $M_1$ bits of status values chosen from the received pseudo-random sequence are taken as a starting phase control word IPh and stored in register $R_2$. In the embodiment, $M_1=32$.

Waveform output reset signal $DDS_{rst}$ resets the DDS module 401 through the DDS reset module, namely when the level of waveform output reset signal $DDS_{rst}$ is low, the level of a DDS enable signal $EN_{DDS}$ outputted by the DDS reset module is also low, the DDS module 401 doesn't work, when the level of waveform output reset signal $DDS_{rst}$ is high, the level of DDS enable signal $EN_{DDS}$ outputted by the DDS reset module is also high, the DDS module 401 starts to work: reading frequency control word $K_f$ from register $R_1$ and generating a $M_1$-bit accumulated address according to the principle of DDS, then adding starting phase control word IPh in register $R_2$ and the $M_1$-bit accumulated address together to obtain a reading address Raddr, then reading waveform data from a waveform memory according to reading address Raddr and taking the waveform data as the output of the DDS module 401. How to synthetize a waveform by a DDS belongs to prior art, no more details are given herein.

The output control module 402 has a counter reset module, an integral period counter and a decimal period counter. Waveform output reset signal $DDS_{rst}$ resets the integral period counter through the counter reset module, namely when the level of waveform output reset signal $DDS_{rst}$ is low, the level of a counter enable signal $EN_{cnt1}$ outputted by the counter reset module is also low, the integral period counter doesn't work and its counting value $CNT_1=0$, at the same time, a decimal period counter enable signal $EN_{cnt2}$ outputted by the integral period counter is also low, which makes the level of a DDS selection signal $SEL_{DDS}$ outputted by the decimal period counter low.

The inputs of the integral period counter comprise reading address Raddr obtained in the DDS module, starting phase control word IPh chosen from the received pseudo-random sequence, a control word NP for number of periods and counter enable signal $EN_{cnt1}$ outputted by the counter reset module, where control word NP for number of periods is composed of the $M_2$ bits of status values chosen from the received pseudo-random sequence. In the embodiment, $M_2=3$.

When waveform output reset signal $DDS_{rst}$ turns from low level to high level, counter enable signal $EN_{cnt1}$ outputted by the counter reset module also turns from low level to high level, which enables the integral period counter to work: counting value $CNT_1$ of the integral period counter is automatically added by 1 according to the two following rules:

rule 1: if Raddr_dly<Raddr, when Raddar_dly≤Iph and Iph≤Raddr, $CNT_1=CNT_1+1$, otherwise, counting value $CNT_1$ remains unchanged;

rule 2: if Raddr_dly>Raddr, when Raddr_dly≤Iph or Iph≤Raddr, $CNT_1=CNT_1+1$, otherwise, counting value $CNT_1$ remains unchanged;

where Raddr_dly is a reading address obtained by delaying reading address Raddr one clock period, namely is the reading address of previous clock period.

When $CNT_1=NP$, decimal period counter enable signal $EN_{cnt2}$ outputted by the integral period counter turns into high level, otherwise, remains at low level, when $CNT_1=2^{M_2}$, enable signal $EN_{DDS}$ is set to low level, which resets the DDS module 402.

$M_3$ bits of status values chosen from the received pseudo-random sequence compose an ending phase control word. Eph, when decimal period counter enable signal $EN_{cnt2}$ turns into high level, which enables the decimal period counter, wherein the inputs of the decimal period counter comprise reading address Raddr obtained in the DDS module, ending phase control word Eph chosen from the received pseudo-random sequence and decimal period counter enable signal $EN_{cnt2}$, DDS selection signal $SEL_{DDS}$ outputted by the decimal period counter changes according to the two following rules:

rule 1: Raddr_dly<Raddr, when Raddr_dly≤Eph and Eph≤Raddr, DDS selection signal $SEL_{DDS}$ turns into high level, otherwise, remains at low level;

rule 2: if Raddr_dly>Raddr, when Raddr_dly≤Eph or Eph≤Raddr, DDS selection signal $SEL_{DDS}$ turns into high level, otherwise, remains at low level.

The output selection module 403 is used for selecting the output of the waveform output module 4 according to DDS selection signal $SEL_{DDS}$: when the level of DDS selection signal $SEL_{DDS}$ is low, selecting the output of the DDS module 401 as the output of the waveform output module 4, when the level of DDS selection signal $SEL_{DDS}$ is high, selecting low level as the output of the waveform output module 4.

The two-channel DAC module 6 has two DACs, which are used for respectively performing a digital to analog conversion on the outputs of the two waveform output modules to obtain two signals that are taken as a transient voltage signal and a transient current signal respectively, namely the random transient power testing signal is obtained.

FIG. 3 is a timing diagram of control signals in accordance with one embodiment of the present invention.

In the embodiment, the whole timing of control signals is shown in FIG. 3. The times of control signals should meet the following relations:

$$\begin{cases} t_5 = t_3 + t_4 \\ t_1 = t_2 + t_5 + t_6 + t_7 \\ T_s \Box 2^{M_2} = t_5 + t_6 \\ t_7 \geq 0 \end{cases}$$

The definitions corresponding to the times of control signals are shown in table 3 respectively.

TABLE 3

| No. | time | definition |
|---|---|---|
| 1 | $t_1$ | the updating period of random transient power testing signal |
| 2 | $t_2$ | time duration of iteration, namely iteration time of 3D_PMLM model |
| 3 | $t_3$ | time duration of integral-period waveform |
| 4 | $t_4$ | time duration of decimal-period waveform |
| 5 | $t_5$ | time duration of the whole output signal in one iteration |
| 6 | $t_6$ | duration of a random idle time |
| 7 | $t_7$ | duration of a reserved and fixed idle time |

In the embodiment, the control words chosen from the pseudo-random sequences are shown in table 4.

TABLE 4

| | control words of transient voltage signal CH1 | | | | control words of transient current signal CH2 | | | |
|---|---|---|---|---|---|---|---|---|
| NO. | NP | Iph | Eph | TNP | NP | Iph | Eph | TNP |
| 1 | 7 | bfee147a | e147ae15 | 7.130 | 0 | 3ff00000 | 00000000 | 0.750 |
| 2 | 2 | 3ff54fca | 42aed13b | 2.011 | 7 | 3faeb851 | eb851eb0 | 7.671 |
| 3 | 6 | bfffe8d2 | d407b28a | 6.078 | 6 | 3ff6458c | d20afa30 | 6.571 |
| 4 | 4 | 3fee4916 | 80f91998 | 4.254 | 0 | bfe3468c | 03f970b4 | 0.266 |
| 5 | 4 | 3fe39df9 | 8a7eae55 | 4.291 | 7 | 3fd60514 | f9ff51c8 | 7.727 |
| 6 | 3 | bff17dd6 | 798c7ed9 | 3.725 | 0 | 3feea084 | 077e5739 | 0.780 |
| 7 | 3 | 3ff91869 | 7afac216 | 3.230 | 5 | bfc16ca3 | ae6a99e4 | 5.932 |
| 8 | 6 | bffb4be2 | c0b8724f | 6.003 | 0 | 3ff6ead5 | 052d6eda | 0.770 |
| 9 | 7 | 3fe7531c | e280eb02 | 7.635 | 7 | bfd18436 | ee2c0dd4 | 7.181 |
| 10 | 7 | bfd8518c | f483cce9 | 7.206 | 6 | 3fdd2202 | d6d5c830 | 6.590 |

In the embodiment, the waveform output module 4 is taken as the waveform output module of transient voltage signal and denoted by channel 1 (CH1), the waveform output module 5 is taken as the waveform output module of transient current signal and denoted by channel 2 (CH2). In table 4, starting phase control word IPh and ending phase control word Eph are binary numbers, control word NP for number of periods is decimal number, TNP is the total number of periods. From table 4, we can see that the chosen control words are random variations and no periodicity.

The chosen control words in table 4 are applied to case 1: the frequency of the outputted transient voltage signal and transient current signal $f_{out}$=50 Hz, updating period $t_1$=200 ms and case 2: the frequency of the outputted transient voltage signal and transient current signal $f_{out}$=1 MHz, updating period $t_1$=100 us.

Figure 5A:
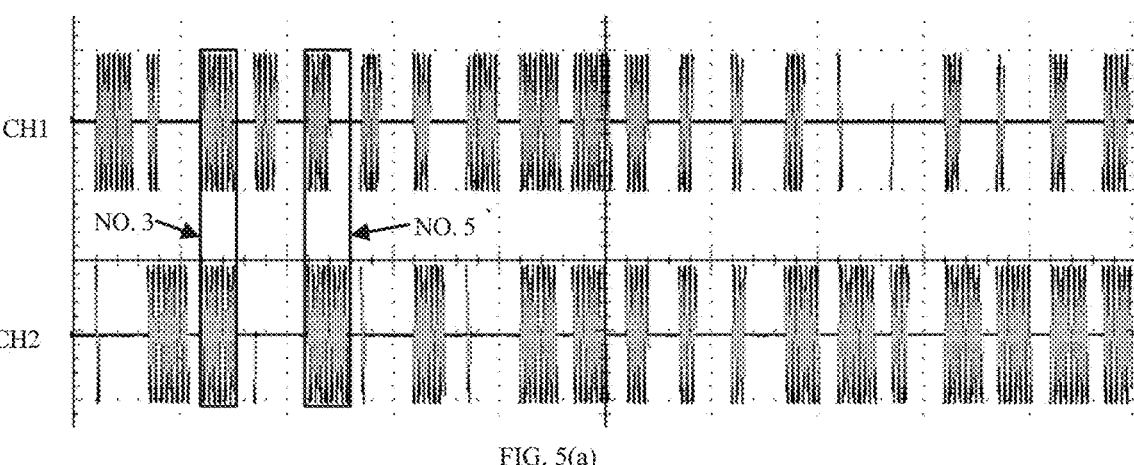
FIG. 5(a)-FIG. 5(e) are waveform diagrams of channel 1 (CH1) and channel 2 (CH2) in case 1, where
Figure 5B:
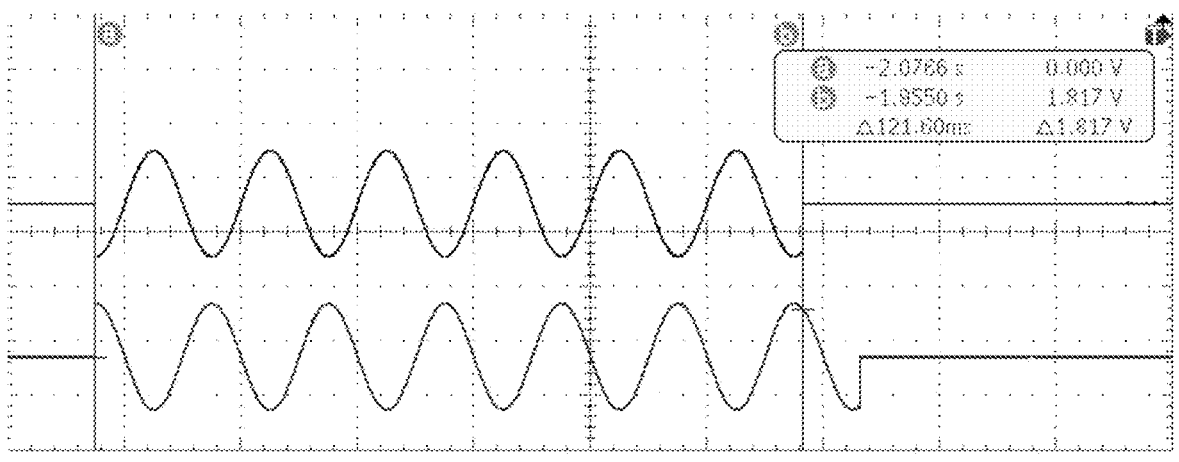
Figure 5C:
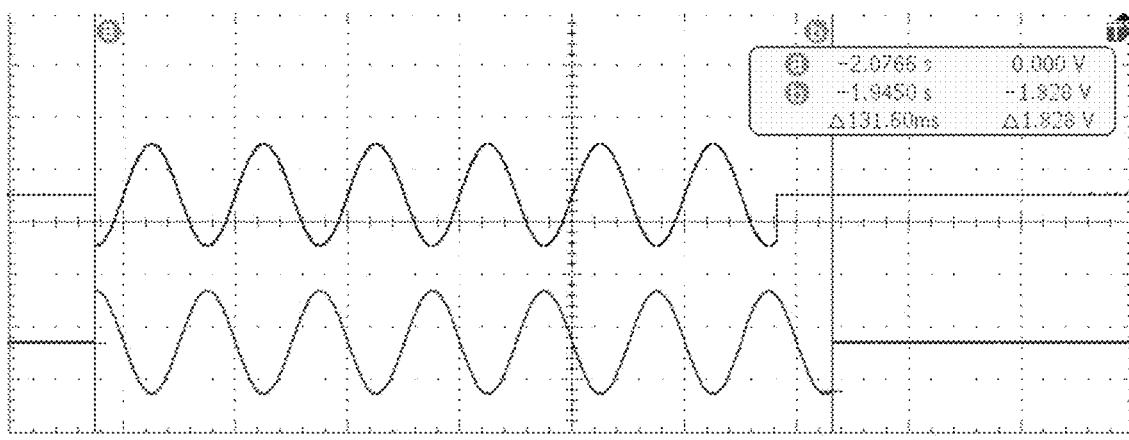
Figure 5D:
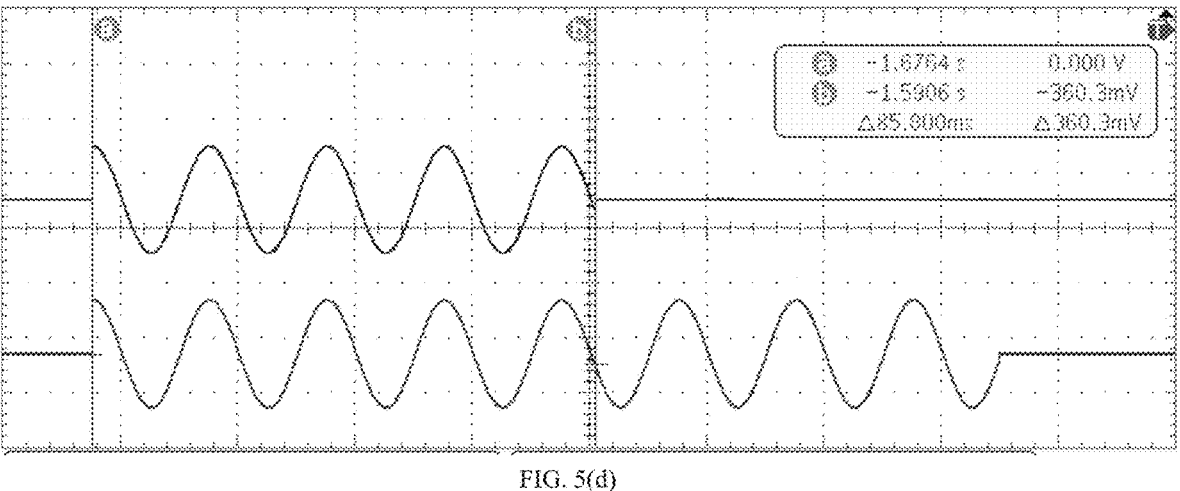
Figure 5E:
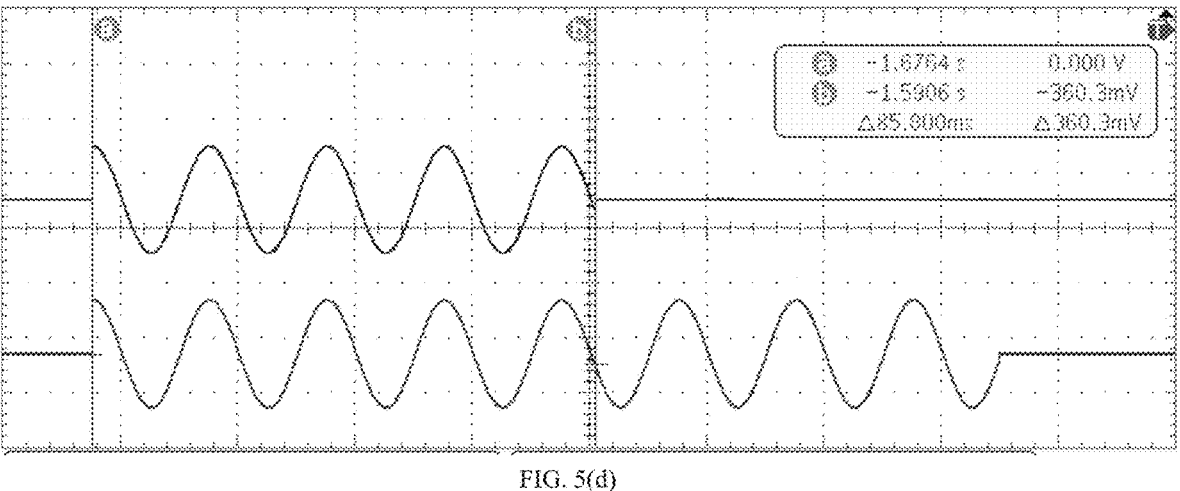

FIG. 5(*a*)-FIG. 5(*e*) are waveform diagrams of channel 1 (CH1) and channel 2 (CH2) in case 1, where FIG. 5(*a*) is a waveform diagram of multiple updating periods of channel 1 and channel 2. For No. 3 period in case 1, as shown in FIG. 5(*b*), duration of the whole output signal of channel 1 (CH1)

in one iteration $t_5$=121.6 ms, the relative error is 0.03%, as shown in FIG. 5(c), duration of the whole output signal of channel 2 (CH2) in one iteration $t_5$=131.6 ms, the relative error is 0.14%. For No. 5 period in case 1, as shown in FIG. 5(d) duration of the whole output signal of channel 1 (CH1) in one iteration $t_5$=85.8 ms, the relative error is 0.03%, as shown in FIG. 5(e), duration of the whole output signal of channel 2 (CH2) in one iteration $t_5$=154.6 ms, the relative error is 0.04%.

Figure 6A:
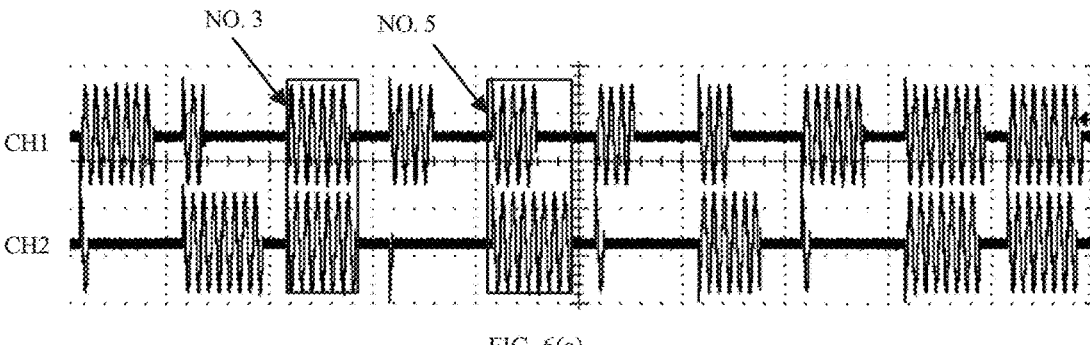
FIG. 6(a)-FIG. 6(e) are waveform diagrams of channel 1 and channel 2 in case 2, where
Figure 6B:
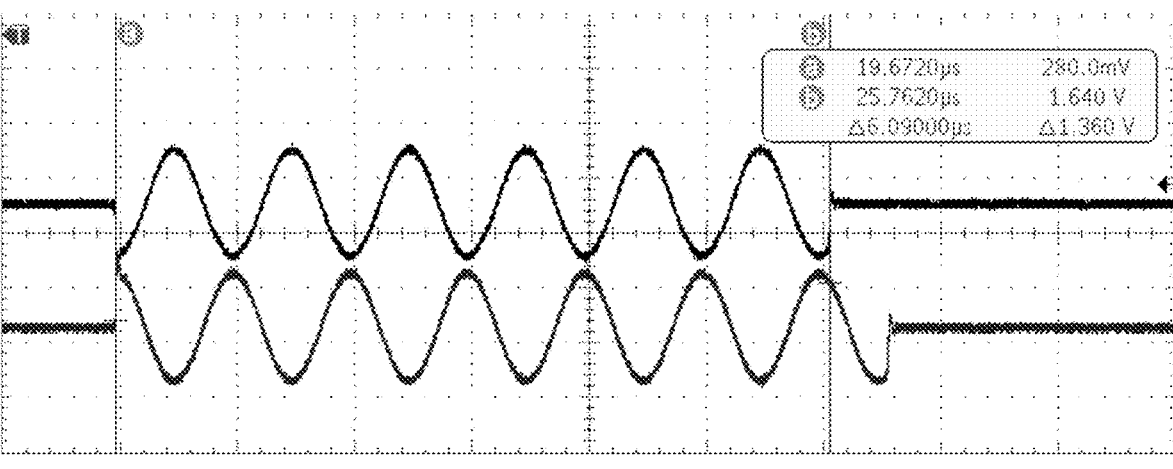
Figure 6C:
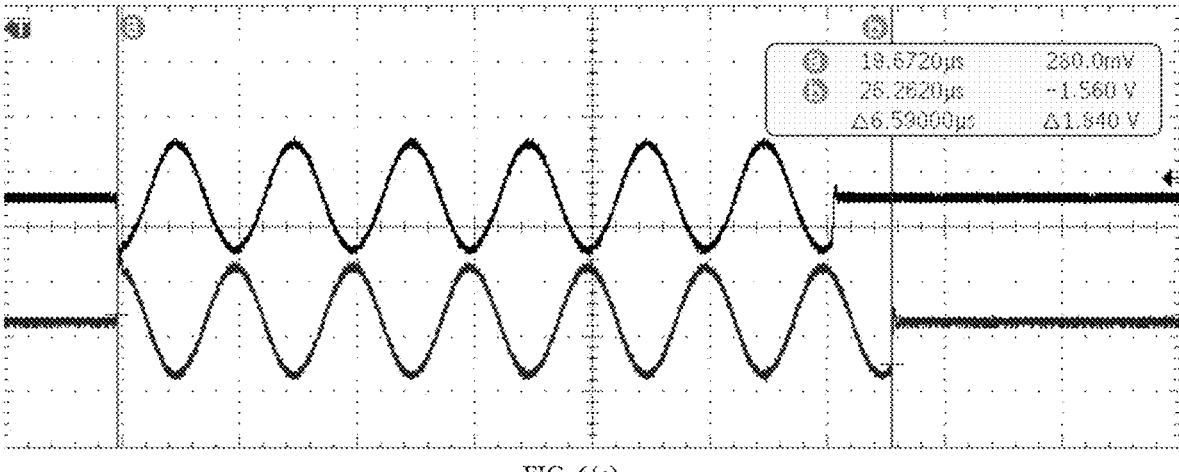
Figure 6D:
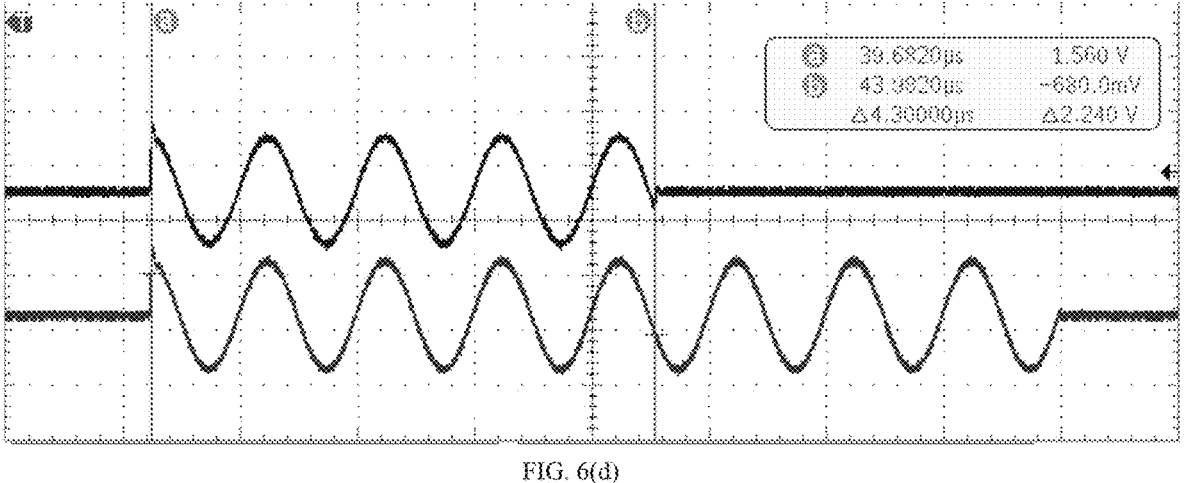
Figure 6E:
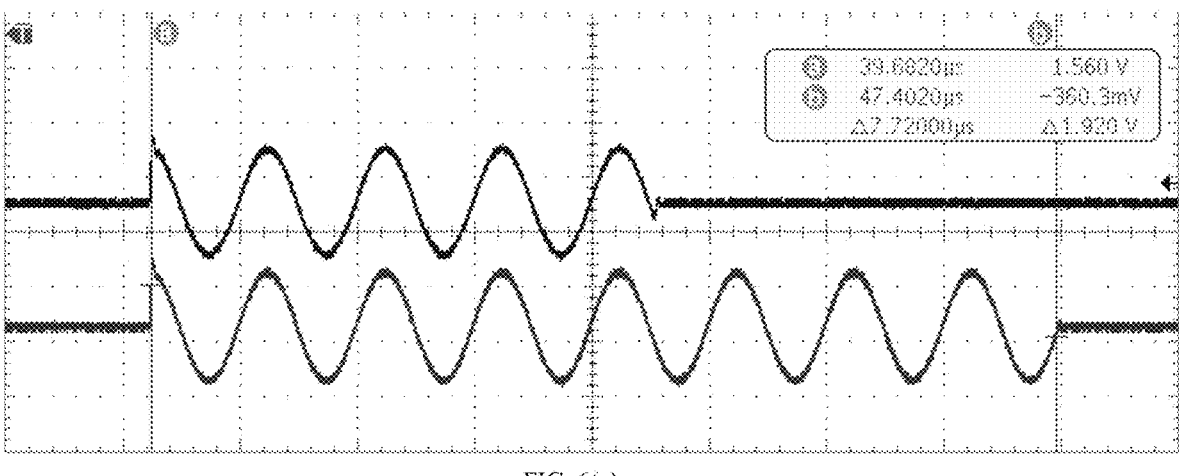

Similarly, FIG. 6(a)-FIG. 6(e) are waveform diagrams of channel 1 (CH1) and channel 2 (CH2) in case 2, where FIG. 6(a) is a waveform diagram of multiple updating periods of channel 1 and channel 2. For No. 3 period in case 2, as shown in FIG. 6(b), duration of the whole output signal of channel 1 (CH1) in one iteration $t_5$=6.09 us, the relative error is 0.20%, as shown in FIG. 6(c), duration of the whole output signal of channel 2 (CH2) in one iteration $t_5$=6.59 us, the relative error is 0.29%. For No. 5 period in case 2, as shown in FIG. 6(d) duration of the whole output signal of channel 1 (CH1) in one iteration $t_5$=4.3 us, the relative error is 0.21%, as shown in FIG. 6(e), duration of the whole output signal of channel 2 (CH2) in one iteration $t_5$=7.72 us, the relative error is 0.09%.

durations and relative errors of different control words and different frequencies are given in table 5.

TABLE 5

| NO. | $t_5$(case 1) ms | | $t_5$(case 2) us | | relative error of $t_5$ (case 1) | | relative error of $t_5$ (case 2) | |
|---|---|---|---|---|---|---|---|---|
| | CH1 | CH2 | CH1 | CH2 | CH1 | CH2 | CH1 | CH2 |
| 1 | 142.6 | 15.2 | 7.12 | 0.76 | 0.00% | 1.30% | 0.14% | 1.33% |
| 2 | 40.2 | 153.6 | 2.01 | 7.69 | 0.03% | 0.11% | 0.05% | 0.25% |
| 3 | 121.6 | 131.6 | 6.09 | 6.59 | 0.03% | 0.14% | 0.20% | 0.29% |
| 4 | 85 | 5.4 | 4.25 | 0.26 | 0.10% | 1.52% | 0.09% | 2.26% |
| 5 | 85.8 | 154.6 | 4.3 | 7.72 | 0.03% | 0.04% | 0.21% | 0.09% |
| 6 | 74.6 | 15.6 | 3.75 | 0.79 | 0.13% | 0.06% | 0.67% | 1.28% |
| 7 | 64.6 | 118.6 | 3.26 | 5.93 | 0.02% | 0.04% | 0.93% | 0.03% |
| 8 | 120 | 15.4 | 6.02 | 0.78 | 0.05% | 0.05% | 0.28% | 1.30% |
| 9 | 152.8 | 143.8 | 7.62 | 7.16 | 0.06% | 0.12% | 0.20% | 0.29% |
| 10 | 144 | 131.8 | 7.22 | 6.6 | 0.08% | 0.00% | 0.19% | 0.15% |

From table 5, we can see that high-precision transient power testing signal (high-precision transient voltage and transient current signal) with random characteristic can be generated in the present invention.

While illustrative embodiments of the invention have been described above, it is, of course, understand that various modifications will be apparent to those of ordinary skill in the art. Such modifications are within the spirit and scope of the invention, which is limited and defined only by the appended claims.

What is claimed is:

1. A random transient power test signal generator based on three-dimensional memristive discrete map, comprising:

a timing control module implemented by a field programmable gate array, which is used for counting a system clock, wherein when the counting value of the timing control module reaches a counting threshold DM_CNT, the output of the timing control module as a system enable signal $En_{sys}$ turns into high level and holds on a system clock cycle, and then turns into low level, the period of system enable signal $En_{sys}$ is the updating period of a random transient power testing signal, which is denoted by $t_1$;

a three-dimensional parallel bi-memristor Logistic map module implemented by the field programmable gate array, which is used for generating two pseudo-random sequences, the mapping model of the three-dimensional parallel bi-memristor Logistic map is:

$$\begin{cases} x_{n+1} = ax_n(1 - x_n) + bx_n(k_0 + k_1 y_n + k_2 y_n^2) + cx_n(h_1 z_n + h_2 z_n^2) \\ y_{n+1} = x_n + y_n \\ z_{n+1} = x_n + z_n \end{cases}$$

where a is a parameter of logistic mapping, b and c respectively are coupling coefficients between discrete memristors $$k_0 + k_1 y_n + k_2 y_n^2, h_1 z_n + h_2 z_n^2$$

and the logistic mapping, $k_0$, $k_1$, $k_2$ respectively are the 0-order coefficient, the 1-order coefficient and the 2-order coefficient of discrete memristor $$k_0 + k_1 y_n + k_2 y_n^2, h_1, h_2$$

respectively are the 1-order coefficient and the 2-order coefficient of discrete memristor $$h_1 z_n + h_2 z_n^2, x_n, y_n \text{ and } z_n$$

respectively are the three-dimensional status values of time n, $x_{n+1}$, $y_{n+1}$ and $z_{n+1}$ respectively are the three-dimensional status values of time n+1;

when a rising edge occurs in system enable signal $En_{sys}$, starting the three-dimensional parallel bi-memristor Logistic map module to update the three-dimensional status values according to the mapping model and inputted three-dimensional initial status values $x_0$, $y_0$, $z_0$; after time duration of $t_2$, ending the update, the time of ending is denoted by L, then taking P three-dimensional status values $x_L$, $x_{L-1}$, . . . , $X_{L-P+1}$ as one pseudo-random sequence, which is denoted by x[P−1: 0], and taking P three-dimensional status values $y_L$, $y_{L-1}$, . . . , $y_{L-P+1}$ as another pseudo-random sequence, which is denoted by y[P−1:0];

meanwhile, when starting the three-dimensional parallel bi-memristor Logistic map module to update the three-dimensional status values, an update status signal $EN_{PMLM}$ outputted by the three-dimensional parallel bi-memristor Logistic map module turns into high level and holds on, when the update ends, update status signal $EN_{PMLM}$ automatically is set to 0;

a waveform output reset module, which is used for generating a waveform output reset signal $DDS_{rst}$, wherein when a rising edge is detected in system enable signal $En_{sys}$, the waveform output reset signal $DDS_{rst}$ is set to low level, when a falling edge is detected in update status signal $EN_{PMLM}$, the waveform output reset signal $DDS_{rst}$ is set to high level;

two waveform output modules, one is used for receiving pseudo-random sequence x[P−1:0], another is used for receiving pseudo-random sequence y[P−1:0], waveform output reset signal $DDS_{rst}$ is sent to the two waveform output modules respectively, wherein the waveform output module comprises a DDS (Direct Digital Synthesizer) module, an output control module and an output selection module;

wherein the DDS module has two registers $R_1$, $R_2$ and a DDS reset module, register $R_1$ is used for storing a frequency control word $K_f$, $M_1$ bits of status values chosen from the received pseudo-random sequence are taken as a starting phase control word IPh and stored in register $R_2$, waveform output reset signal $DDS_{rst}$ resets the DDS module through the DDS reset module, namely when the level of waveform output reset signal $DDS_{rst}$ is low, the level of a DDS enable signal $EN_{DDS}$ outputted by the DDS reset module is also low, the DDS module doesn't work, when the level of waveform output reset signal $DDS_{rst}$ is high, the level of DDS enable signal $EN_{DDS}$ outputted by the DDS reset module is also high, the DDS module starts to work: reading frequency control word $K_f$ from register $R_1$ and generating a $M_1$-bit accumulated address according to the principle of DDS, then adding starting phase control word IPh in register $R_2$ and the $M_1$-bit accumulated address together to obtain a reading address Raddr, then reading waveform data from a waveform memory according to reading address Raddr and taking the waveform data as the output of the DDS module;

wherein the output control module has a counter reset module, an integral period counter and a decimal period counter, waveform output reset signal $DDS_{rst}$ resets the integral period counter through the counter reset module, namely when the level of waveform output reset signal $DDS_{rst}$ is low, the level of a counter enable signal $EN_{cnt1}$ outputted by the counter reset module is also low, the integral period counter doesn't work and its counting value $CNT_1=0$, at the same time, a decimal period counter enable signal $EN_{cnt2}$ outputted by the integral period counter is also low, which makes the level of a DDS selection signal $SEL_{DDS}$ outputted by the decimal period counter low;

wherein the inputs of the integral period counter comprise reading address Raddr obtained in the DDS module, starting phase control word IPh chosen from the received pseudo-random sequence, a control word NP for number of periods and counter enable signal $EN_{cnt1}$ outputted by the counter reset module, where control word NP for number of periods is composed of the $M_2$ bits of status values chosen from the received pseudo-random sequence;

when waveform output reset signal $DDS_{rst}$ turns from low level to high level, counter enable signal $EN_{cnt1}$ outputted by the counter reset module also turns from low level to high level, which enables the integral period counter to work: counting value $CNT_1$ of the integral period counter is automatically added by 1 according to the two following rules:

rule 1: if Raddr_dly<Raddr, when Raddr_dly≤Iph and Iph≤Raddr, $CNT_1=CNT_1+1$, otherwise, counting value $CNT_1$ remains unchanged;

rule 2: if Raddr_dly>Raddr, when Raddr_dly≤Iph or Iph≤Raddr, $CNT_1=CNT_1+1$, otherwise, counting value $CNT_1$ remains unchanged;

where Raddr_dly is a reading address obtained by delaying reading address Raddr one clock period, namely is the reading address of previous clock period;

when $CNT_1=NP$, decimal period counter enable signal $EN_{cnt2}$ outputted by the integral period counter turns into high level, otherwise, remains at low level;

when $CNT_1=2^{M_2}$, DDS enable signal $EN_{DDS}$ is set to low level, which resets the DDS module;

$M_3$ bits of status values chosen from the received pseudo-random sequence compose an ending phase control word Eph, when decimal period counter enable signal $EN_{cnt2}$ turns into high level, which enables the decimal period counter, wherein the inputs of the decimal period counter comprise reading address Raddr obtained in the DDS module, ending phase control word Eph chosen from the received pseudo-random sequence and decimal period counter enable signal $EN_{cnt2}$, DDS selection signal $SEL_{DDS}$ outputted by the decimal period counter changes according to the two following rules:

rule 1: if Raddr_dly<Raddr, when Raddr_dly≤Eph and Eph≤Raddr, DDS selection signal $SEL_{DDS}$ turns into high level, otherwise, remains at low level;

rule 2: if Raddr_dly>Raddr, when Raddr_dly≤Eph or Eph≤Raddr, DDS selection signal $SEL_{DDS}$ turns into high level, otherwise, remains at low level;

wherein the output selection module is used for selecting the output of the waveform output module according to DDS selection signal $SEL_{DDS}$: when the level of DDS selection signal $SEL_{DDS}$ is low, selecting the output of the DDS module as the output of the waveform output module, when the level of DDS selection signal $SEL_{DDS}$ is high, selecting low level as the output of the waveform output module;

a two channel Digital to Analog Converter (DAC), each channel configured for respectively performing a digital to analog conversion on the outputs of the two waveform output modules to obtain two signals that are taken as a transient voltage signal and a transient current signal respectively, namely the random transient power testing signal is obtained, the random transient power testing signal constituted of the transient voltage signal and the transient current signal being input to a smart power meter connected to an equipment under test to simulate a dynamic power to the equipment.

\* \* \* \* \*